(12) United States Patent
Mills et al.

(10) Patent No.: US 9,661,777 B2
(45) Date of Patent: May 23, 2017

(54) SYSTEMS AND METHODS FOR COUPLING AC POWER TO A RACK-LEVEL POWER INFRASTRUCTURE

(71) Applicant: DELL PRODUCTS L.P., Round Rock, TX (US)

(72) Inventors: Richard S. Mills, Cedar Park, TX (US); Edmond I. Bailey, Cedar Park, TX (US); John Stuewe, Round Rock, TX (US); Kunrong Wang, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/224,739

(22) Filed: Aug. 1, 2016

(65) Prior Publication Data

US 2016/0345459 A1    Nov. 24, 2016

Related U.S. Application Data

(63) Continuation of application No. 14/838,892, filed on Aug. 28, 2015, now Pat. No. 9,438,012, which is a continuation of application No. 14/202,550, filed on Mar. 10, 2014, now Pat. No. 9,172,219, which is a continuation of application No. 13/364,110, filed on Feb. 1, 2012, now Pat. No. 8,708,736.

(51) Int. Cl.
| | |
|---|---|
| *H05K 7/14* | (2006.01) |
| *G06F 1/26* | (2006.01) |
| *H02B 1/26* | (2006.01) |
| *H02B 3/00* | (2006.01) |

(52) U.S. Cl.
CPC ............ *H05K 7/1492* (2013.01); *G06F 1/26* (2013.01); *H02B 1/26* (2013.01); *H02B 3/00* (2013.01); *Y10T 29/49117* (2015.01); *Y10T 29/49119* (2015.01)

(58) Field of Classification Search
CPC ........ G06F 1/26; G06F 1/189; H05K 7/1492; H02B 1/26
See application file for complete search history.

(56) References Cited

U.S. PATENT DOCUMENTS

| | | | |
|---|---|---|---|
| 5,721,934 A | 2/1998 | Scheurich | 713/320 |
| 5,821,636 A | 10/1998 | Baker et al. | 307/70 |
| 5,847,545 A | 12/1998 | Chen et al. | 320/138 |
| 6,229,691 B1 | 5/2001 | Tanzer et al. | 361/622 |
| 6,486,407 B1 | 11/2002 | Hawker et al. | 174/149 B |
| 6,528,970 B1 | 3/2003 | Liu et al. | 320/107 |

(Continued)

*Primary Examiner* — Ross Gushi
(74) *Attorney, Agent, or Firm* — Baker Botts L.L.P.

(57) ABSTRACT

In accordance with the present disclosure, a detachable power cable interface box (PCIB) for coupling AC power to a rack-level power infrastructure is described. The detachable PCIB includes a body section and a terminal disposed within the body section. The terminal may be coupled to an AC power source. A wiring block may also be disposed within the body, and the modular wiring block may be coupled to the terminal. The wiring block may arrange power input from the AC power source into a pre-determined output configuration corresponding to a detachable interface. The system may also include the detachable interface, and the detachable interface may be configured to couple with an integrated connector of the rack-level power infrastructure. The detachable interface may be common to all types of AC power sources.

20 Claims, 11 Drawing Sheets

(56) References Cited

U.S. PATENT DOCUMENTS

| | | |
|---|---|---|
| 6,923,684 B2 | 8/2005 | Strayer .................. 439/652 |
| 6,967,283 B2 | 11/2005 | Rasmussen et al. ............ 174/50 |
| 7,140,922 B2 | 11/2006 | Luu et al. ................ 439/651 |
| 7,141,891 B2 | 11/2006 | McNally et al. ............. 307/39 |
| 7,173,821 B2 | 2/2007 | Coglitore ................ 361/695 |
| 7,196,900 B2 | 3/2007 | Ewing et al. ............. 361/642 |
| 7,215,535 B2 | 5/2007 | Pereira ................ 361/624 |
| 7,312,980 B2 | 12/2007 | Ewing et al. ............. 361/622 |
| 7,358,625 B2 | 4/2008 | Cheng et al. ................ 307/18 |
| 7,368,830 B2 | 5/2008 | Cleveland et al. .......... 307/13 |
| 7,550,871 B2 | 6/2009 | Price et al. ................ 307/38 |
| 7,606,014 B2 | 10/2009 | Ziegler et al. ............. 361/93.1 |
| 7,619,868 B2 | 11/2009 | Spitaels et al. ............ 361/115 |
| 7,777,365 B2 | 8/2010 | Cleveland ................ 307/13 |
| 7,808,775 B2 | 10/2010 | Cherney et al. ........... 361/624 |
| 7,830,043 B1 | 11/2010 | Michael et al. ............. 307/149 |
| 7,948,113 B2 | 5/2011 | Abe ................ 307/32 |
| 7,982,335 B2 | 7/2011 | Aldag et al. ................ 307/12 |
| 8,027,134 B2 | 9/2011 | Ziegler et al. ............. 361/93.1 |
| 8,097,979 B2 | 1/2012 | Berke et al. ................ 307/31 |
| 8,212,427 B2 | 7/2012 | Spitaels et al. ............ 307/147 |
| 8,264,099 B2 | 9/2012 | Aldag et al. ............. 307/12 |
| 8,305,737 B2 | 11/2012 | Ewing et al. ............. 361/622 |
| 8,427,815 B2 | 4/2013 | Fontana et al. ........... 361/624 |
| 8,503,149 B2 | 8/2013 | Spitaels et al. ............ 361/115 |
| 8,708,736 B2 | 4/2014 | Bailey et al. ............. 439/535 |
| 8,935,011 B2 | 1/2015 | Tischer ................ 700/295 |
| 8,972,752 B2 | 3/2015 | Bailey et al. ............. 713/300 |
| 8,976,515 B2 | 3/2015 | Schmitt et al. .......... 361/679.02 |
| 9,172,219 B2 | 10/2015 | Mills et al. ............. 361/622 |
| 9,281,717 B2 | 3/2016 | Bailey et al. ............. 307/150 |
| 9,301,420 B2 | 3/2016 | Bailey et al. |
| 2002/0134567 A1 | 9/2002 | Rasmussen et al. ........... 174/50 |
| 2002/0189848 A1 | 12/2002 | Hawker et al. ........... 174/149 B |
| 2003/0112647 A1 | 6/2003 | Liu et al. ................ 363/144 |
| 2004/0085694 A1 | 5/2004 | Germagian et al. ......... 361/90 |
| 2004/0148060 A1 | 7/2004 | Lee ................ 700/295 |
| 2004/0231875 A1 | 11/2004 | Rasmussen et al. ........... 174/50 |
| 2005/0094336 A1 | 5/2005 | Cleveland ................ 361/64 |
| 2005/0101193 A1 | 5/2005 | Godard ................ 439/652 |
| 2005/0141252 A1 | 6/2005 | Mollo ................ 363/101 |
| 2005/0225292 A1 | 10/2005 | Damlamian et al. ......... 320/128 |
| 2007/0109736 A1 | 5/2007 | Coglitore ................ 361/683 |
| 2007/0291433 A1 | 12/2007 | Ziegler et al. ............. 361/93.1 |
| 2009/0018706 A1 | 1/2009 | Wittner ................ 700/295 |
| 2009/0309542 A1 | 12/2009 | Hung et al. .............. 320/111 |
| 2009/0323382 A1 | 12/2009 | Xu ................ 363/178 |
| 2010/0041277 A1 | 2/2010 | Huber et al. ............. 439/638 |
| 2010/0187906 A1 | 7/2010 | Berke et al. ................ 307/24 |
| 2010/0231161 A1 | 9/2010 | Brown ................ 320/101 |
| 2010/0254162 A1 | 10/2010 | Lanni ................ 363/15 |
| 2011/0043986 A1 | 2/2011 | Conn et al. ............. 361/679.02 |
| 2011/0050438 A1 | 3/2011 | Kadathur et al. ........... 340/644 |
| 2011/0099389 A1 | 4/2011 | Matula et al. ............. 713/300 |
| 2011/0169342 A1 | 7/2011 | Tinaphong et al. ......... 307/126 |
| 2011/0227556 A1 | 9/2011 | Ivchenko et al. ........... 323/318 |
| 2011/0237097 A1 | 9/2011 | Aldag et al. ................ 439/94 |
| 2011/0244715 A1 | 10/2011 | Aldag et al. ............. 439/488 |
| 2012/0019207 A1 | 1/2012 | Kuo et al. .................. 320/111 |
| 2012/0116590 A1 | 5/2012 | Florez-Larrahondo et al. ............. 700/275 |
| 2012/0120306 A1 | 5/2012 | Schindler et al. .......... 348/372 |
| 2012/0295483 A1 | 11/2012 | Smed ................ 439/620.21 |
| 2012/0319480 A1 | 12/2012 | Jansma ................ 307/38 |
| 2013/0015714 A1 | 1/2013 | Kwok ................ 307/75 |
| 2013/0052872 A1 | 2/2013 | Magee, Jr. ............. 439/620.21 |
| 2013/0140915 A1 | 6/2013 | Spitaels et al. ............ 307/147 |
| 2013/0148248 A1 | 6/2013 | Zhou ................ 361/103 |
| 2013/0169049 A1 | 7/2013 | Lo et al. ................ 307/39 |
| 2013/0193764 A1 | 8/2013 | Bailey et al. ............. 307/66 |
| 2013/0194726 A1 | 8/2013 | Bailey et al. ............. 361/637 |
| 2013/0198532 A1 | 8/2013 | Bailey et al. ............. 713/300 |
| 2013/0198533 A1 | 8/2013 | Bailey et al. ............. 713/300 |
| 2013/0198534 A1 | 8/2013 | Bailey et al. ............. 713/300 |
| 2013/0200689 A1 | 8/2013 | Park et al. ................ 307/2 |
| 2013/0200704 A1 | 8/2013 | Pyle ................ 307/31 |
| 2014/0192456 A1 | 7/2014 | Mills et al. ............. 361/622 |
| 2015/0070846 A1 | 3/2015 | Shelnutt et al. ............. 361/700 |
| 2015/0143140 A1 | 5/2015 | Bailey et al. ............. 713/300 |
| 2015/0372462 A1 | 12/2015 | Mills et al. ............. 361/622 |
| 2016/0094089 A1 | 3/2016 | Bailey et al. ............. 307/66 |

SYSTEMS AND METHODS FOR COUPLING AC POWER TO A RACK-LEVEL POWER INFRASTRUCTURE

CROSS REFERENCES TO RELATED APPLICATIONS

This application is a continuation of U.S. patent application Ser. No. 14/838,892 filed on Aug. 28, 2015, which is a continuation of U.S. patent application Ser. No. 14/202,550 filed Mar. 10, 2014, now U.S. Pat. No. 9,172,219 granted Oct. 27, 2015, which is a continuation of U.S. patent application Ser. No. 13/364,110 filed Feb. 1, 2012, now U.S. Pat. No. 8,708,736 granted Apr. 29, 2014, the contents of which are incorporated herein by reference in their entirety for all purposes.

TECHNICAL FIELD

The present disclosure relates generally to the operation of computer systems and information handling systems, and, more particularly, a rack level scalable and modular power infrastructure.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

Information handling systems may comprise server systems that are deployed in racks. These servers may be powered by, for example, alternating current (AC) power. AC power may be of different types depending on location. Servers and power infrastructure of a rack-server system may have to be configured differently depending on the type of AC power. Unfortunately, rewiring a power infrastructure to accommodate the different types of power sources available at various geological regions and locations may increase the cost and deployment time of a rack server system, as well as require an electrician to ensure that the power infrastructure is wired correctly.

SUMMARY

In accordance with the present disclosure, a detachable power cable interface box (PCIB) for coupling AC power to a rack-level power infrastructure is described. The detachable PCIB includes a body section and a terminal disposed within the body section. The terminal may be coupled to an AC power source. A wiring block may also be disposed within the body, and the modular wiring block may be coupled to the terminal. The wiring block may arrange power input from the AC power source into a pre-determined output configuration corresponding to a detachable interface. The system may also include the detachable interface, and the detachable interface may be configured to couple with an integrated connector of the rack-level power infrastructure. The detachable interface may be common to all types of AC power sources.

The system and method disclosed herein is technically advantageous because it allows for interchangeability and modularity in powering racks and servers. Specifically, the detachable PCIB may allow for a modular power infrastructure design that couples to an AC power source through a common interface on the detachable PCIB instead of having to be rewired to accommodate different power types. Additionally, the detachable PCIBs may be Underwriters Laboratories (UL) approved, meaning that the AC power can be coupled to the detachable PCIB on site, and then coupled to the power infrastructure without requiring an electrician. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Illustrative embodiments of the present disclosure are described in detail herein. In the interest of clarity, not all features of an actual implementation may be described in this specification. It will of course be appreciated that in the development of any such actual embodiment, numerous implementation-specific decisions must be made to achieve the specific implementation goals, which will vary from one implementation to another. Moreover, it will be appreciated that such a development effort might be complex and time-consuming, but would nevertheless be a routine undertaking for those of ordinary skill in the art having the benefit of the present disclosure.

Figure 1:
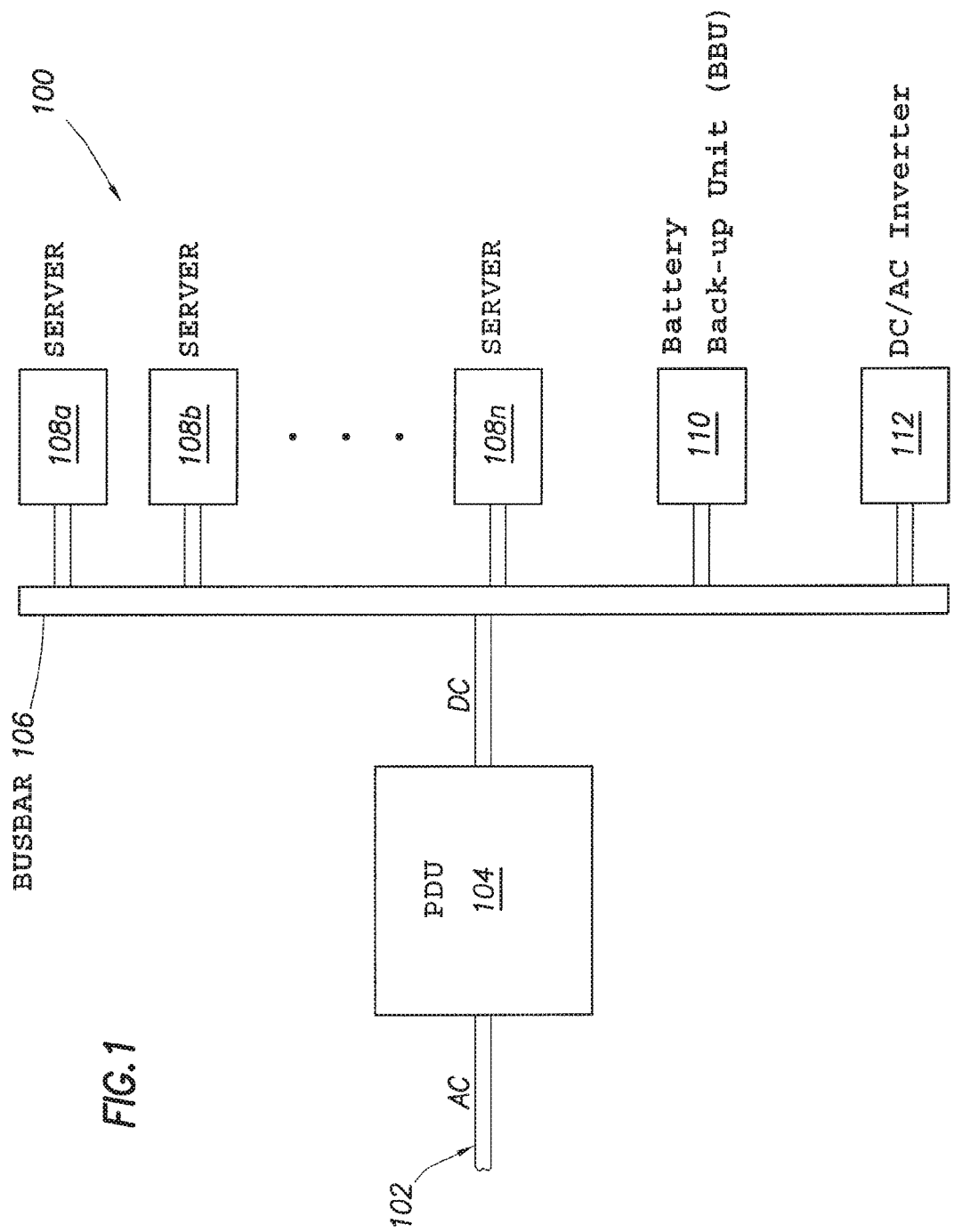
FIG. 1 shows an example rack-level, scalable and modular power infrastructure, according to aspects of the present disclosure.

Shown in FIG. 1 is an example rack-level, scalable and modular power infrastructure 100, in accordance with aspects of the present disclosure. The power infrastructure 100 may be used to power servers in any rack/server environment, such as a data center, or in other server environments, as would be appreciated by one of ordinary skill in the art in view of this disclosure. The power system 100 may receive AC power 102 from a power source. In certain embodiments, AC power 102 may be from a common public power grid at a data center site. As will be discussed below, the power infrastructure 100 is advantageous because it may be modular, scalable, and may accept various types of input AC power.

The AC power 102 may be received at a power distribution unit (PDU) 104. As will be described below, the PDU 104 may include multiple, single-phase commodity power supply units (PSUs), as well as a phase-balancing and distribution configuration that balances power consumption across the power phases of the AC power 102. The PDU 104 may output DC power to a common rail, such as busbar 106, which may be kept at a common 12 volt potential. Advantageously, the PDU 104 may be modular and scalable according to the amount of power required by the servers. For example, in certain embodiments, the PDU 104 may be cross-cabled with a second PDU to provide redundant AC input. The redundant AC input may provide an alternate source of AC input power, such that sufficient DC power can be provided to the rack server system should one AC input power source fail. Likewise, the PSUs may be added or removed depending on the power required by the load.

Busbar 106 may be coupled to server components, such as servers 108a-n, and power infrastructure components, such as PDU 104, Battery back-up unit (BBU) 110, and DC/AC inverter 112. Busbar 106, for example, may be connected via cables to servers 108a-n, and may supply the servers 108a-n with the 12 V DC power supply. Notably, servers 108a-n may include DC/DC power supply units instead of AC/DC power supply units common in typical rack servers, or may accept 12 V DC power directly from the 12 V common rail. This may decrease the size, weight, and heating requirements of a typical rack-mount server.

A BBU 110 may charge from busbar 106 when AC power 102 is provided, and discharge to busbar 106 when AC power 102 is lost. As will also be discussed below, a BBU may also be included inside the PDU 104 within a form-factor chassis similar to the chassis of a commodity PSU. In some data centers, the entire AC power feed may be conditioned using large, expensive batteries to provide an uninterruptible power system (UPS) to all racks/servers within the data center. By including a battery back up within the rack-level power infrastructure, the input power may be fed directly to the racks and conditioned at the rack-level, and the entire AC power feed may not need to be uninterruptible. This may reduce the need for an external UPS, reduce the cost of powering the data center, and improve power efficiency.

The power infrastructure 100 may also include AC power outlets, which may be useful for rack operation and maintenance. In certain embodiments, a DC/AC inverter 112 may be coupled to the busbar 106. The DC/AC inverter 112 may receive the common 12 V power from the busbar 106 and output AC power via common three-prong electrical connections, for example. In certain embodiments, AC power outlets may also be included within the PDU 104, as will be discussed below.

Figure 2:
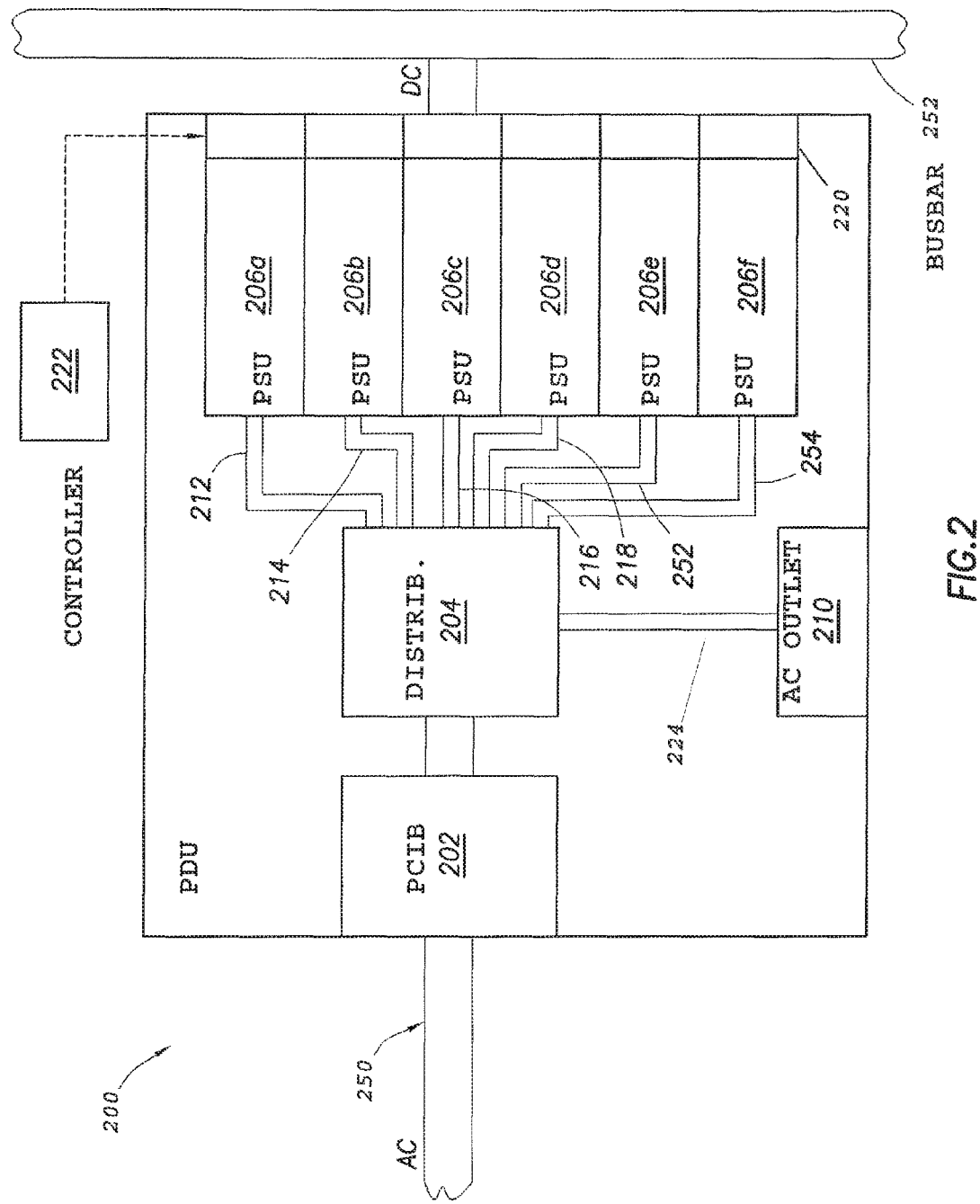
FIG. 2 shows an example power distribution unit, according to aspects of the present disclosure.

FIG. 2 shows a functional diagram of an example PDU 200, in accordance with aspects of the present disclosure. In certain embodiments, the PDU 200 may be used in a power infrastructure similar to power infrastructure 100 from FIG. 1, with the PDU 200 receiving AC power 250 and outputting DC power to busbar 252. PDU 200 may comprise a rack-mountable chassis in which the power elements of the PDU 200 are disposed. The PDU 200 may receive AC power 250 at power cable interface box (PCIB) 202. In certain embodiments, as will be described below, the PCIB 202 may include modular components which allowing the PCIB 202 to accept multiple types of AC power without rewiring by an electrician. These multiple type of AC power may include single-phase, three-phase Delta, three-phase Wye, interruptible, and noninterruptible, and may comprise numerous voltages levels, including 110V, 208V, 220V, 230V, 240V, and 277V.

AC power 250 received at the PCIB 202 may be connected to a distribution element 204. The distribution element 204 may represent a wiring scheme whereby phase-balanced power is distributed to power elements disposed within the PDU 200. In certain embodiments, distribution element 204 may be coupled to PSUs 206*a-f* via connectors 212-218, 252, and 254, respectively. Connectors 212-218, 252, and 254 may carry phase-balanced AC power to commodity PSUs 206*a-f*, which may then output DC power. In the embodiment shown, where the distribution element couples to six PSUs, a three-phase input AC power may be balanced across the PSUs. For example, each phase of AC power 102 may be balanced across two PSUs, so that no phase is loaded with more PSUs than any other phase. In certain embodiments, the distribution element 204 may also provide AC power outlets at element 210 via cable 224.

The PSUs 206*a-f* may comprise commodity PSUs installed into appropriately sized slots within the PDU 200. In certain embodiments, the PSUs 206*a-f* may couple with and output power through connectors 220 disposed within the PDU 104. In certain embodiments, the connectors 220 may comprise card slots or other form-factor connectors with pre-defined pin configurations. For example, PSUs 206*a-f* may couple with connectors 220. The connectors may comprise ATX form factor connectors, or other commodity connection types that would be appreciated by one of ordinary skill in view of this disclosure. The PSUs 206*a-f* may receive control signals from a power infrastructure controller 222 through the connectors. The power infrastructure controller 222 may also send control signals to other power elements, as will be described below.

Figure 3:
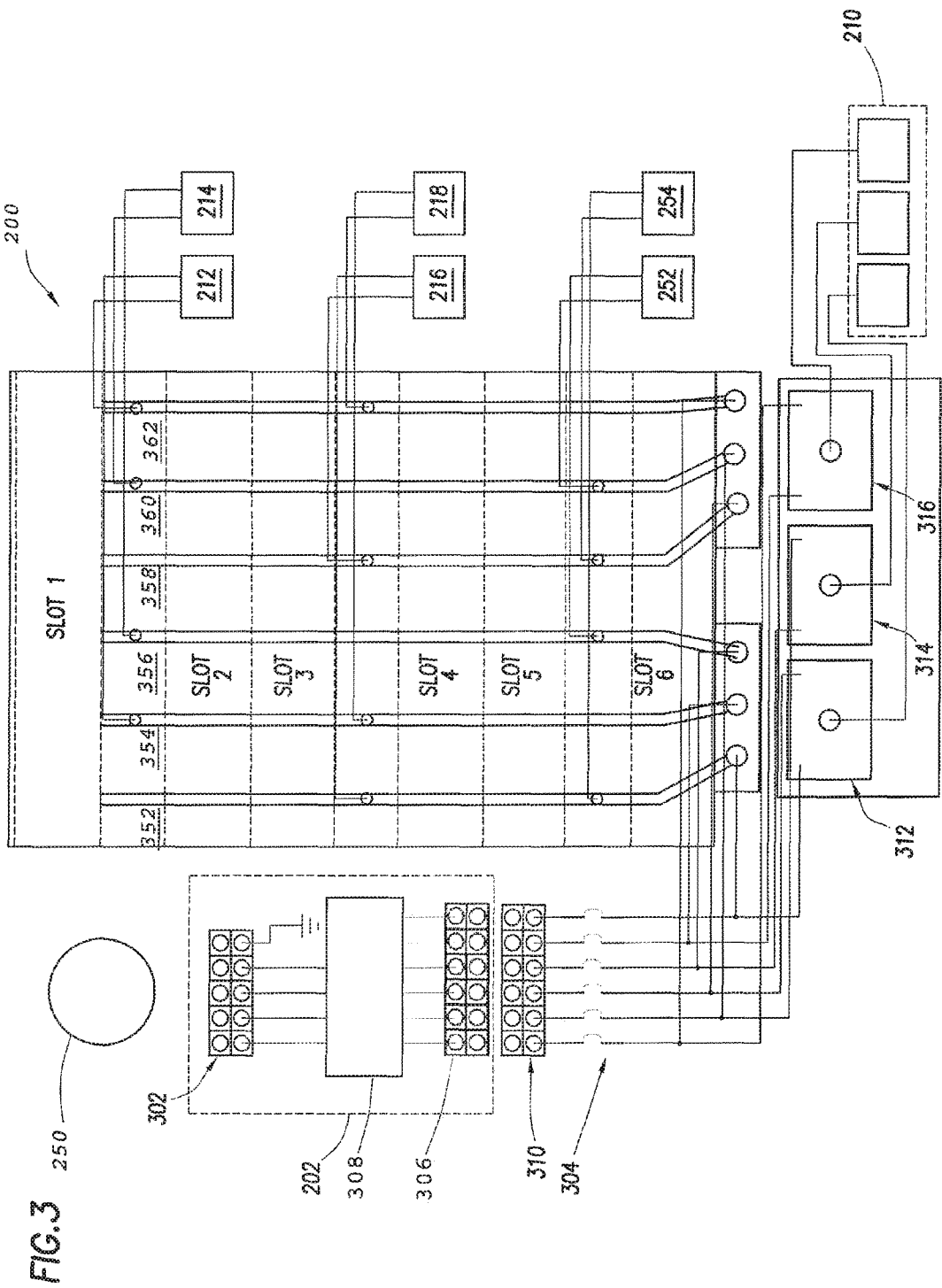
FIG. 3 shows a wiring diagram of an example power distribution unit, according to aspects of the present disclosure.

FIG. 3 illustrates an example wiring diagram of PDU 200, as represented, in part, by distribution element 204 in FIG. 2. Although the wiring diagram is show relative to PDU 200, the wiring diagram may be used in other PDUs, as would be appreciated by one of ordinary skill in view of this disclosure. AC power 250 may be received via a plurality of wires at PCIB 202, represented by the box around elements 302, 306, and 308. The wires received from AC power 250 may differ according to the type of AC power 250. For example, in a three-phase power, the wires may comprise three live wires corresponding to the three phases of the power supply, as well as a neutral wire (N) and a ground wire (G). The AC power 250 may be coupled to the PCIB via a first terminal 302. Following the first terminal 302, some or all of the wire may be input into a wiring block 308, which may be coupled to a second terminal 306. As can be seen, the wiring block 308 may receive three live wires, as well as the neutral wire from the terminal 302. The ground wire may be coupled to either Earth ground or electrical ground after terminal 302.

The wires may be output from the wiring block 308 to the second terminal 306. The wiring block 308 may arrange the wires received from terminal 302 into a pre-determined wiring arrangement at second terminal 306, which corresponds to the wiring arrangement of terminal 310. In certain embodiments, the wiring block 308 may comprise a printed circuit board (PCB) designed for a particular input power type, and interchangeable within the PCIB 202 depending on the type of input power 250. For example, a wiring block may be dedicated to single-phase, three-phase Delta, or three-phase Wye power. By swapping the wiring block 308, the PDU can be configured to accommodate a variety of different input AC power types without an extensive rewiring.

The wiring block 310 may arrange the wires from the AC power into a pre-determined configuration. The pre-determined configuration may correspond to the ports of terminal 310. For example, in certain embodiments, the terminal 310 may accept wires in a common arrangement for all AC input types. Accordingly, wiring block 310 may comprise a PCB which arranges the input AC wires from within the PCIB 202 to correspond to the wiring arrangement of the terminal 310. Example wiring blocks are described below in FIG. 5*b*.

In certain embodiments, some of the wires output from the terminal 310 may be fed into a breaker 304. The breaker 304 may comprise circuit breakers well known in the art, and the live wires may each be connected to an individual breaker to protect against power surges. Following breaker 204, each of the wires output from terminal 310 may be coupled individually to a dedicated cable, such as wireways 352-362. The wireways 352-362 may be connected in a staggered configuration with outlets 212-218 as well as outlets 252 and 254. For example, outlet 212 may be coupled to wireways 354 and 362, and outlet 214 may be coupled to wireways 356 and 360. Notably, each of the outlets 212-218 as well as 252 and 254 may be coupled to a unique combination of two dedicated wireways. As can be seen, the staggered configuration is designed such that each wireway 352-362 is connected to only two outlets 212-218, 252, and 254, and may therefore each be connected to two PSUs. In cases with three-phase input power, as shown, each phase of input AC power 250, through arranging the AC power wires at the wiring block 308 and terminal 310, and staggering the outlets 212-218, 252, and 254 across the dedicated wireways 352-362, may see a generally equal amount of power draw from the load.

In addition to the wireways 352-362, the input AC power may be connected to relays 312, 314, and 316, which are coupled to switched AC outlets 210. As can be seen, each of the relays 312, 314, and 316 may be coupled to two different wires from terminal 310. In certain embodiments, the relays may include mechanical or electrical switches located locally at the rack, allowing some or all of the outlets 210 to be turned on and off. In certain embodiments, the relays may be triggered from a remote source, allowing an administrator, for example, to power up secondary server gear without being physically located at a data center site.

Figure 4:
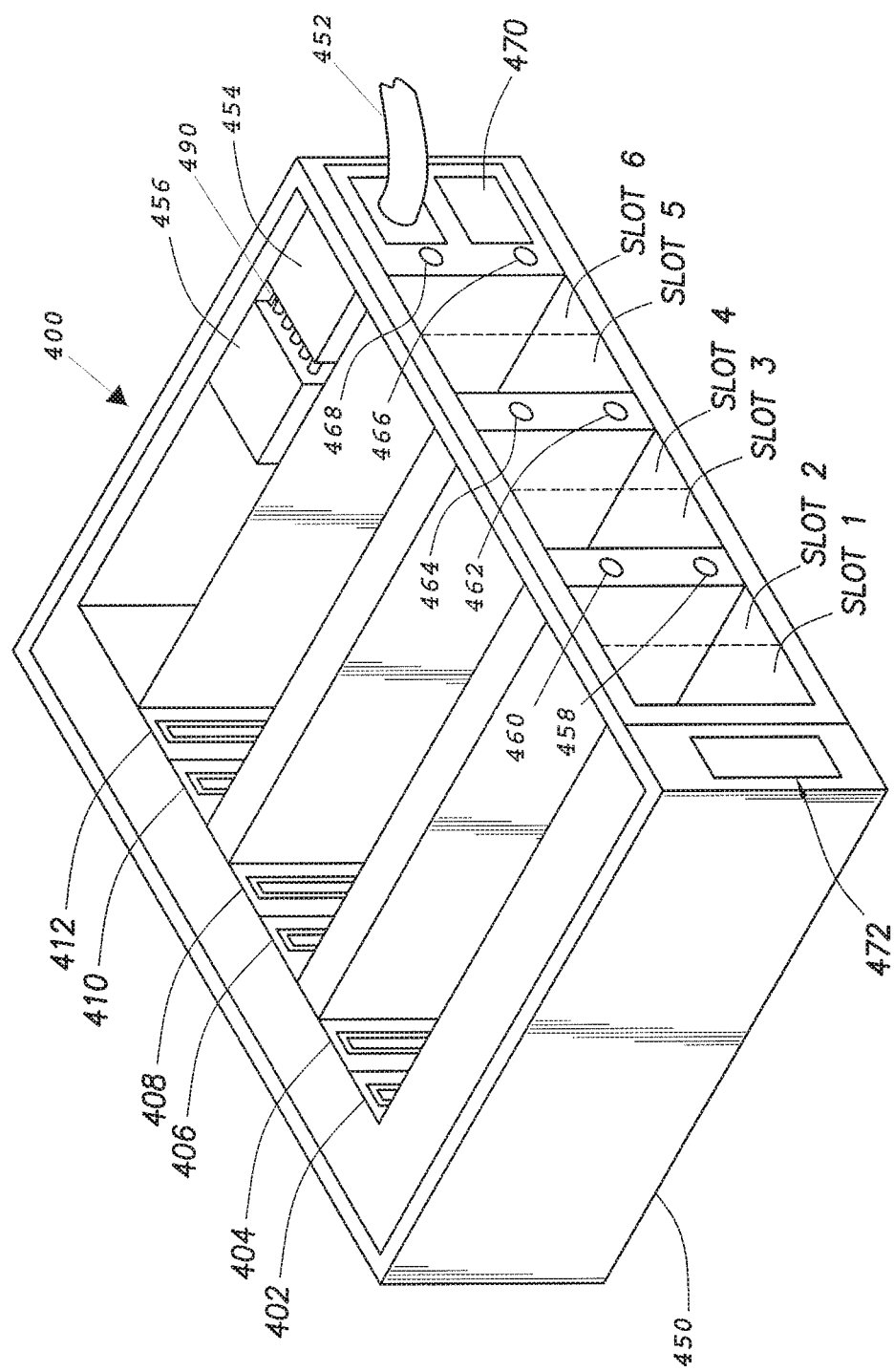
FIG. 4 shows an isometric view of a chassis of an example power distribution unit, according to aspects of the present disclosure.

FIG. 4 illustrates an isometric view of an example PDU 400 deployed in a rack-mountable chassis 450, with a top section removed to better illustrate the internal configuration. PDU 400 may include a similar wiring diagram to the wiring diagram illustrated in FIG. 3. AC power 452 may be received at the PDU 400 through PCIB 454. In certain embodiments, the PDU 400 may include breakers 470, which may in some embodiments be accessible from the from of the PDU 400. In the embodiment shown, PCIB 454 may be detachable, and may connect with the PDU 400 through a detachable interface 490, as will be described below with respect to FIG. 5*a*. The PCIB 454 may connect with a terminal 456 integrated into the PDU 400 via the detachable interface 490. In certain embodiments, the AC power 452 may then be phase balanced and distributed to connections 458-468 and switchable connections (not shown), as described above with respect to FIG. 3. Notably, each of the connections 458-468 may comprise common three-prong power cables that are either integrated into the PDU 400 or are connected at one end to the outlets integrated into the PDU 400 and at the other end to an outlet disposed on a commodity PSU installed within one of Slots 1-6. The slots 1-6 may be sized to accommodate commodity PSUs. In other embodiments, depending on the form factor of the PSUs, other numbers of PSUs, such as 9 or 12, can be incorporated into the PDU to achieve a higher power total. In such embodiments, with, for example, a three-phase AC input power, the distribution wiring would need to be modified such that each of the phases supplies the same number of PSUs. In three-phase power applications, PSU numbers in a multiple of three is preferred to maintain balance.

Each of Slots 1-6 may be similarly sized, elongated cuboid openings and may accept a similarly sized form factor, commodity PSU. PSUs may be inserted through the front opening, adjacent to the connectors 458-468, and pushed into the PSU. In certain embodiments, a connector at the back of the PSU may engage with a connector disposed at the back of each slot, Slot 1-6, opposite the front of the PDU. The connectors 402-412 may comprise card slots that engage with a form-factor card protruding from the back of each PSU (not shown). Each form factor card, for example, may have the same pin-out configuration, receiving control signal from a power infrastructure controller, such as power infrastructure controller 222, and outputting power through the same pins. In certain embodiments, the connectors 402-412 may comprise other connectors well known in the art, such as ATX form factor connectors, as would be appreciated by one of ordinary skill in the art in view of this disclosure. The connectors 402-412 may be coupled to a busbar (not shown), such as busbar 106 from FIG. 1, through which the PSU may supply DC power to servers within a rack structure. The PDU 400 may also comprise a power infrastructure controller 470 integrated into the PDU structure and communicating at least with the PSUs coupled to the PDU through connectors 402-412.

Figure 5A:
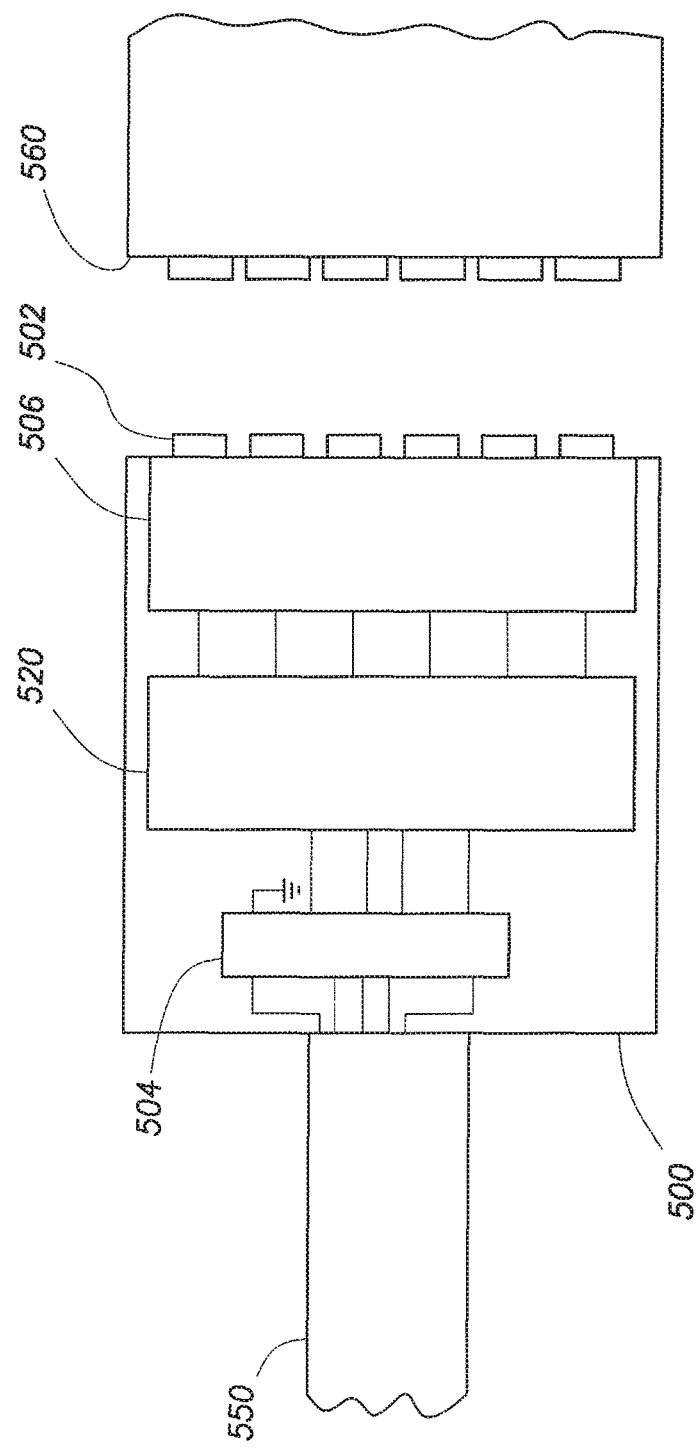
FIG. 5a shows an example modular power connector, according to aspects of the present disclosure.

FIG. 5a illustrates an example detachable PCIB 500, similar to the PCIB 454 in FIG. 4, which incorporates a detachable interface 502 and allows for insertion/coupling and removal/decoupling of power from a PDU. In certain embodiments, when the PCIB 500 is inserted into the PDU, the PCIB 500 may be secured to the PDU body to maintain ground contact. The AC power configuration in current data centers varies based several different parameters, including current rating, such as 20, 30, or 50 amps; phase number, such as single or 3 phase; cable length; voltage, such as 208V, 220V, 240V, or 277V; and configuration, such as Wye or Delta. This results in a very large number of potential power configurations, leading to a long lead-time to build custom solutions to specific customer needs. By providing a detachable and modular PCIB that attaches to a PDU with a universal interface, the PDU can be manufactured as a modular unit with a pre-determined interface to the PCM, with the interface being common to all PCIBs. The PCIB can then be coupled to power sources of any type—including the power types mentioned above as well as High Voltage DC—and connected to the common interface. This allows the PDU to accept any power type without the PDU having to be reconfigured or rewired. Rather, the configuration is limited to, for example, the wiring block in the PCIB.

As can be seen, the detachable PCIB 500 may comprise a rectangular body section coupled to the AC power 550. In certain embodiments, the detachable PCIB 500 may be coupled to AC power 550 via terminal 504 in the body section before the detachable PCIB 500 is inserted into a PDU. In the embodiment shown, the detachable PCIB 500 includes terminals 504 and 506. In certain embodiments, a detachable PCIB may include elements similar to the terminals shown in FIG. 3. In addition, the detachable PCIB 500 may include a wiring block 520, positioned between terminal 504 and terminal 506. The wiring block 520 may comprise a PCB and may arrange the power from AC power 550 into a pre-determined output configuration corresponding to the detachable interface, similar to wiring block 308 described above. The detachable interface may, for example, include a pre-determined pin configuration, and the wires from the AC power 550 may be arranged to correspond to the pre-determined pin configuration of the detachable interface. The type of wires and power coupled to each pin may be common across all types of AC power, such that the detachable PCIB 500 can be coupled to a PDU through, for example, an integrated connector 560, and the PDU would accept AC power from the detachable PCIB 500 without having to be modified at all.

In certain embodiments, such as the embodiment shown in FIG. 5a, a six pin detachable interface 502 may be used to connect any single-phase, and various three-phase AC power feeds to the PDU via an integrated connector 560 with the power earth or power ground, directly connected to the PCIB 500. The six-pin interface 502 and the integrated connector 560 may include complementary pin configuration, ensuring that the correct wires from the AC power are connected to the correct terminal in the PDU. Each of the pins of the six-pin interface may be used regardless of the input-power type. By utilizing the six-pin configuration in a universal way, the PCIB 500 and wiring block 520 may be designed in a modular fashion, decreasing the cost and the deployment time.

In certain other embodiments (not shown), an eight-pin interface may be utilized, consisting of the six-pins described above as well as a PG pin and an input voltage identification pin that indicates, for example, when an input voltage is 277V. The PG pin may connect the power or earth ground through the PDU, while the input voltage identification pin may be used to differentiate a high input AC voltage, such as 277V, from other lower input AC voltages. The PDU may respond to a signal on the input voltage identification pin, indicating for example a 277V input voltage, by automatically disabling at least one power element in the PDU. In certain embodiments, the PDU may disable switchable outlets at the PDU to protect any device connected to the switchable outlets from being exposed to the high voltage, while still proving power to PSUs disposed within the PDU. As will be appreciated by one of ordinary skill in the art in view of this disclosure, each pin of the interface 502 is not required to be in use for all power types. Rather, for single phase power types, for example, some of the pins may not be used.

Advantageously, a detachable PCIB such as PCIB 500 in FIG. 5a may allow for a modular power infrastructure design that couples to an AC power source through a common interface on the detachable PCIB instead of having to be rewired to accommodate different power types. Additionally, the detachable PCIBs may be Underwriters Laboratories (UL) approved, meaning that the AC power can be coupled to the detachable PCIB on site, and then coupled to the power infrastructure without requiring an electrician.

Figure 5B:
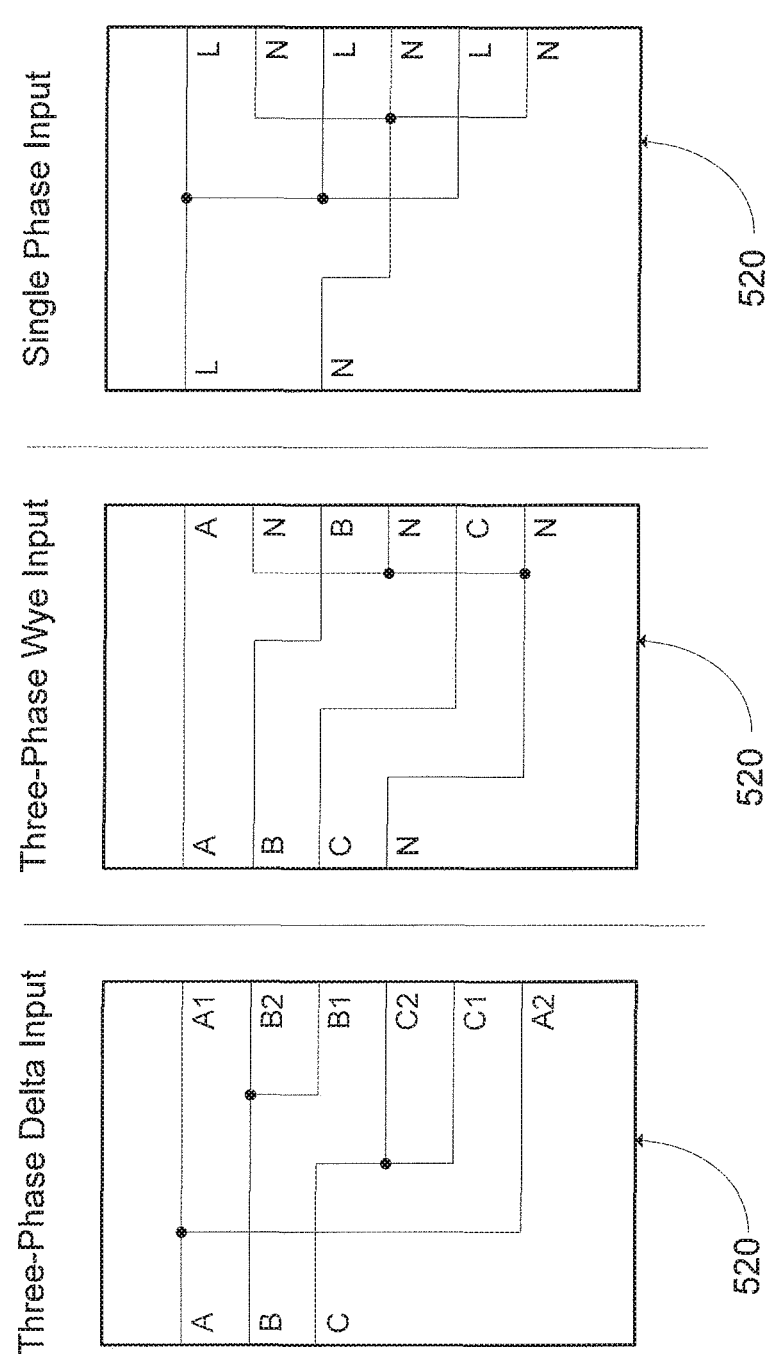
FIG. 5b shows example wiring blocks, according to aspects of the present disclosure.

FIG. 5b shows example wiring block configurations for three-phase Delta input power, three-phase Wye input power, and single phase input power. As can be seen, each of the example wiring blocks arranges the input power into a universal six wire output that may interchangeably correspond, for example, to the pre-determined wiring arrangement at a PDU. The three-phase Delta power input, for example, may include three input wires, A, B, and C. The wiring block may arrange the wires such that six wires—A1, B2, B1, C2, C1, A2—are output from the wiring block. The three-phase Wye power input, for example, may include four wires, A, B, C, and N and the wiring block may be arranged to provide a six wire output—A, N, B, N, C, N. The single phase power input, for example, may include two wires, L and N, and the wiring block may be arranged to provide a six wire output—L, N, L, N, L, N. Notably, in each example, the wiring block may outputs a six wire arrangement. Each wiring block may be used interchangeably in a PCIB, for example, with the correct wiring block being selected for the type of input power. The wiring block output may then be coupled to a terminal within the PCIB which corresponds to an input terminal at the PDU. The configuration may be advantageous because configuring the input power may be accomplished apart from the design of a PDU, simplifying the design and allowing for modularization.

Figure 6:
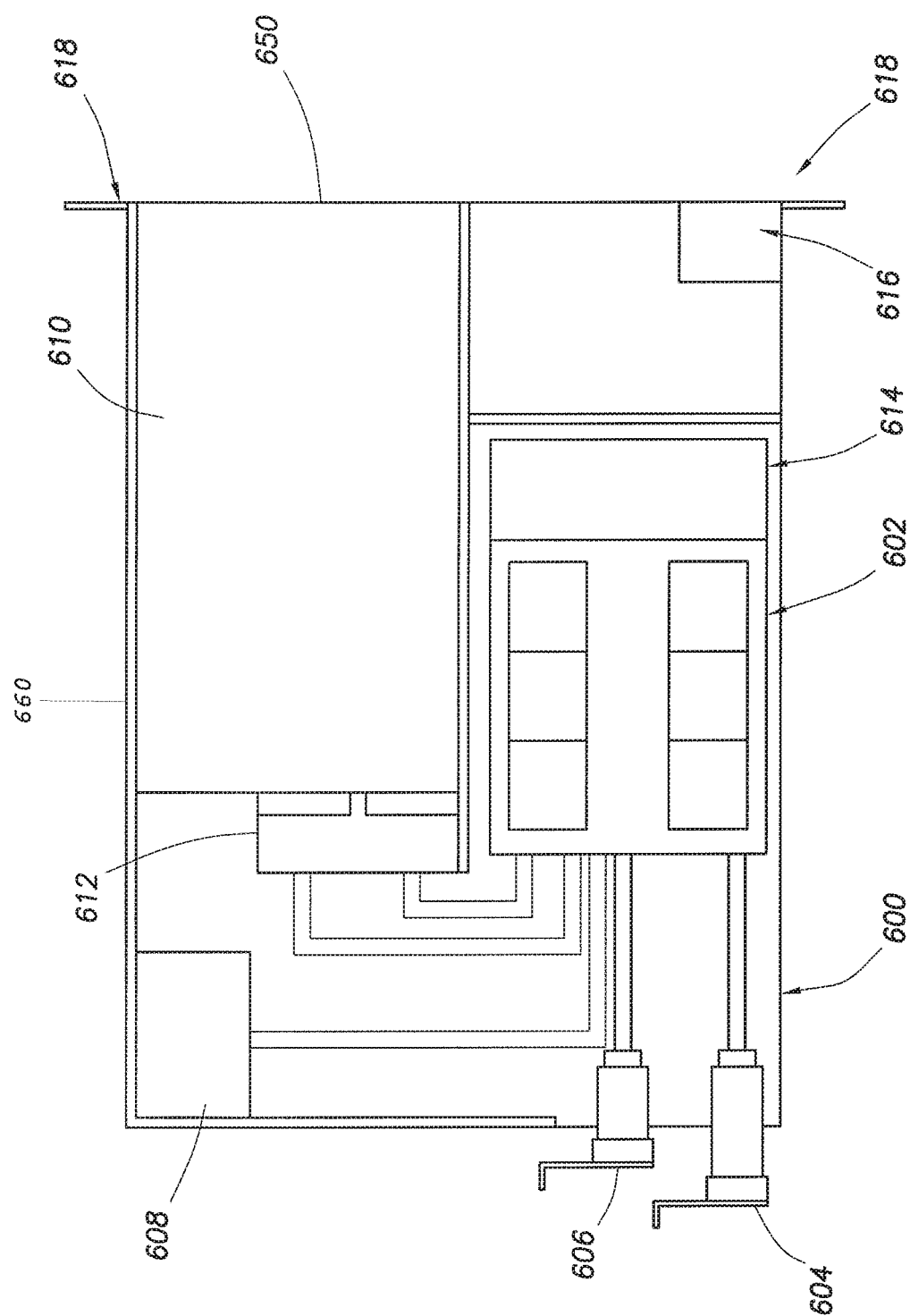
FIG. 6 shows an example battery back-up unit (BBU) system deployable within an rack-level, scalable and modular power infrastructure, according to aspects of the present disclosure.

Returning to FIG. 1, a BBU, such as BBU 110, may also be included within the power infrastructure, receiving DC power from a busbar to charge the internal batteries, and outputting DC power to the busbar when the AC power source fails or is lost. FIG. 6 illustrates an example BBU system 600 which may be sized similarly to a rack server, and mountable within a rack using tabs 618, positioned at the front to the BBU system 600. In certain other embodiments, such as the embodiment shown in FIGS. 7a and 7b, a BBU system may be disposed within the PDU.

The BBU system 600 may include at least one battery 610 within a battery drawer 650. The battery 610 may comprise multiple types, including Lithium Polymer and valve-regulated lead-acid (VRLA), and the BBU system 600 may receive and store power at multiple voltage levels, including 18V, 48V, and 240V-400V DC. In addition, the BBU system 600 may comprise redundant batteries. The battery drawer 650 may be open at the front of the BBU system 600, allowing the batteries 610 to be easily accessed and interchanged for maintenance and other operational conditions. In certain embodiments, the battery 610 may be hot-swappable. The battery 610 may be electrically coupled to power modules 602 via connector 612. The power modules 602 may comprise multiple power modules, for example six or eight power modules, depending on the amount of power input to the BBU system 600. The power modules 602 may be coupled to a DC busbar, such as busbar 106 from FIG. 1, via busbar connector 604, and also may be coupled to a ground return via busbar connection 606. The power modules 602 may act as a power conversion and regulation device which converts generally variable battery voltage to a regulated voltage on the 12 V common rail in discharge mode, and vice versa in charge mode. The power modules 602 may also be configured to accommodate variable DC inputs, such as The power modules 602 may be in parallel operation with current or load sharing.

The power modules 602 may cause the battery 610 to either be charged by the input DC power from busbar connector 604, or discharge DC power to a busbar through busbar connector 604. In certain embodiments, the BBU system 600 may receive at a power module controller 614 a control signal through a PDU interface 608. The control signal may come from a power infrastructure controller, such as power infrastructure controller 222, and may indicate, for example, that the PDU has lost AC power. The control signal may comprise, for example, a simple network management protocol (SNMP) signal. The power module controller 614 may respond to the control signal by issuing a control command to the power modules 602. If the PDU is receiving AC power, for example, the power modules 602 may cause the BBU to be in a charge mode, where the DC power from the DC busbar is used to charge the battery 610. If the PDU is not receiving power, for example, the power modules 602 may cause the BBU to be in a discharge mode, where the battery 610 outputs power to the DC busbar. The BBU system 600 may further include an emergency power off 616, which functions as a kill switch to the BBU 110.

In certain embodiments, the BBU system 600 may further communicate bi-directionally with a power controller, such as power infrastructure controller 222, to allow for power capping during battery usage as well as to allow the server system, or an administrator accessing the server system, to have information about the BBU system 600. The information may include information used for power management, including, but not limited to, battery state, battery health, battery capacity, and battery temperature. Additionally, the BBU system 600 may communicate with a power controller to allow for both passive and active power sharing between the power infrastructure and the BBU system 600. For example, a power controller may communicate with the BBU system 600 to vary the amount of power used by the BBU system 600 to charge battery 610.

Although the BBU system 600 is shown with busbar connections 604 and 606, receiving for example a 12 V DC input power, other configurations are possible. For example, BBU system 600 may receiver power from a PDU through a cable instead of a busbar. Additionally, instead of 12 V DC input power, the BBU system 600 may receiver a higher voltage level DC power, such as 48 V or up to 400V, through an additional connector (not shown). Other configurations would be appreciated by one of ordinary skill in the art in view of this disclosure.

Figure 7A:
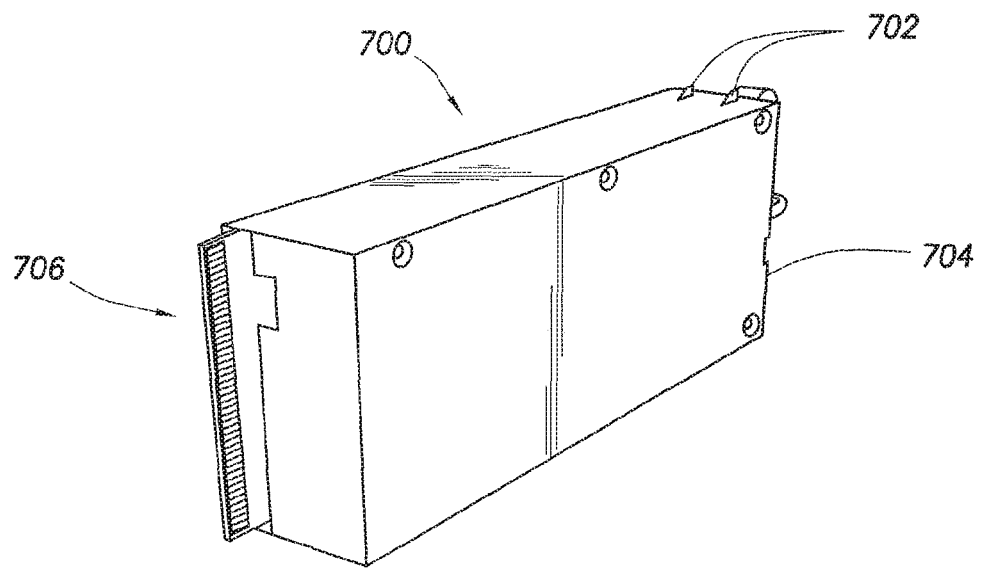
FIGS. 7a and 7b show an example BBU system deployable within an example power distribution unit, according to aspects of the present disclosure.

In certain embodiments, a power infrastructure, such as the power infrastructure in FIG. 1, may include a BBU element within the PDU, either alone or in addition to a rack mounted BBU, such as BBU system 600. FIG. 7a shows an example BBU system 700 incorporated into a form-factor chassis 704 similar to a commodity PSU described above. Notably, chassis 704 may be sized to fit within a commodity power supply unit (PSU) slot in a power distribution unit (PDU), such as Slot 1 in FIG. 4, instead of a commodity PSU.

As can be seen, BBU system 700 includes an example form-factor connector, connector card 706, protruding from the back of the chassis 704. This connector card 706 may comprise a pre-determined pinout configuration that matches the pinout configuration of a similarly-sized commodity PSU, so the BBU system 700 is swappable with a commodity PSU within the PDU. In certain embodiments, the connector card 706 may coupled to a card connector within a PDU, such as connectors 402-412 in FIG. 4. In addition to the connector card 706, the chassis 700 may include form-factor alignment and latching mechanisms 702 similar to a commodity PSU.

Figure 7B:
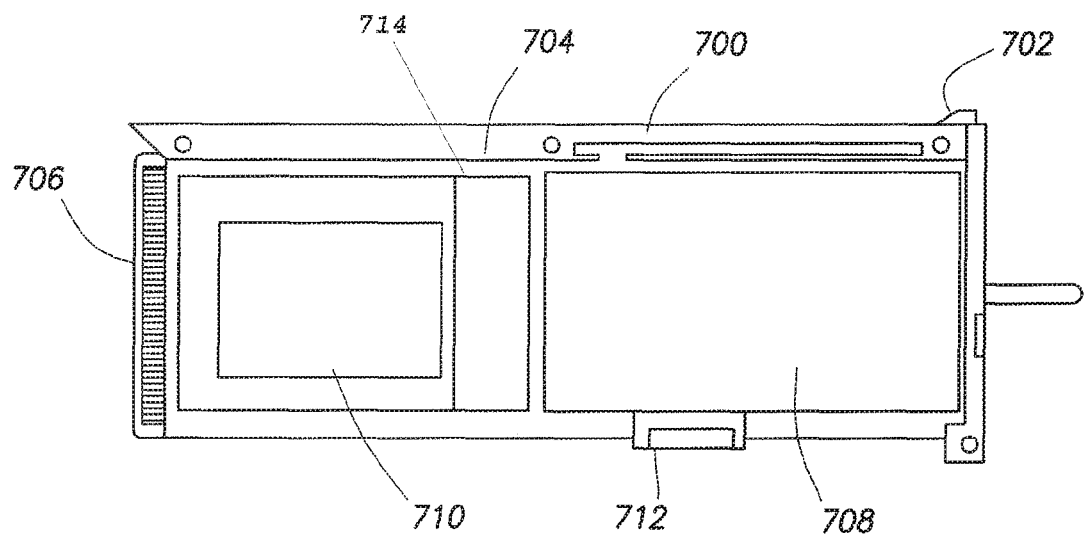

FIG. 7b shows an example configuration of a BBU system 700 with one side of the chassis 704 removed. As can be seen, the BBU system 700 comprises a battery 708 and a power module 710, with the battery 708 coupled to the power module 710 via cable 712. The BBU system 700 may further include a power module controller 714 coupled to the power module 710. In certain embodiments, control signals and power may be received through pre-determined pins on the card connector 706. The module controller 714 may receive the control signals can cause the power modules to charge the battery 708 with the received DC power or to output power from the battery 708 through the card 706.

Figure 8:
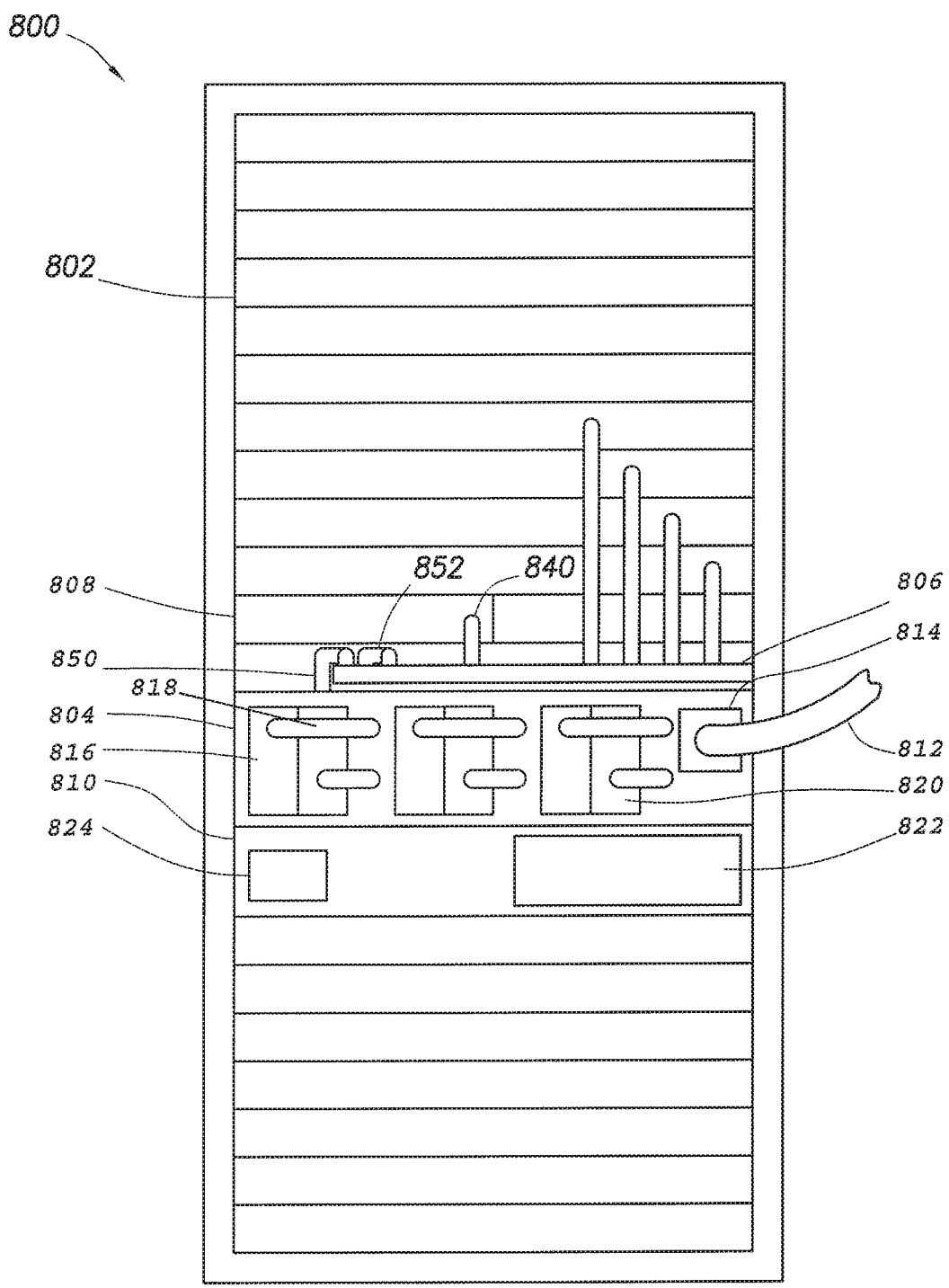
FIG. 8 shows an example rack server system incorporating elements of an example rack-level, scalable and modular power infrastructure, according to aspects of the present disclosure.

FIG. 8 illustrates an example rack server system incorporating aspects of an example modular and scalable power distribution system, according to aspects of the present invention. The rack server system includes a rack 800, populated with server systems 802, a PDU 804, a busbar 806, a DC/AC inverter 808, and a BBU system 810. The PDU 804 may receive AC input power 812 via detachable PCIB 814. Multiple single-phase, commodity PSUs, such as PSU 816 and 820 may be installed into slots within PDU 804, receive phase-balanced AC power from the PDU over, for example, connectors 818, and output DC power to busbar 806 via cable 852. In certain embodiments, the PDU 804 may for example, further comprise a BBU system deployed within the PDU 804 instead of PSU 820, sized similarly to the single-phase, commodity PSU 820, and which receives power from and outputs power to the busbar 806.

Additionally, a BBU system 810 and a DC/AC inverter 808 may also be coupled to the busbar 806. The BBU system 810, for example, may be similar to the BBU system 600 in FIG. 6, and may comprise a battery slot 822, and an emergency power-off 824. The BBU system 810 may also include power modules (not shown) that cause the BBU system 810 to either receive power from busbar 806 or output power to busbar 806 via cable 850. Likewise, DC/AC inverter 808 may receive DC power from the busbar 806 via cable 840. The DC/AC inverter 808, however, may provide AC output power at common three-prong power outlets, allowing common networking equipment to be powered without an additional AC input line and in cases when the AC input fails or is lost.

Each of the servers 802 may receive DC power from a PDU 804 or BBU system 810 via busbar 806. Each of the servers may accept external 12 V DC power, instead of AC/DC power supplies common in most server applications. In instances where the AC input power 812 is lost, BBU system 810 may output power onto the busbar 806, powering servers 802 and inverter 808 until AC input power 812 can be restored. As would be appreciated by one of ordinary skill in view of this disclosure, the figure illustrating system 800 is simplified. In a physical implementation, additional connections would be included to each of the servers, and such connections may include additional power equipment, such as wires, cables, busbars. Additionally, each system may have multiple 12 V power domains, with different 12 V busbars, that can be either stand-alone or interconnected.

Figure 9:
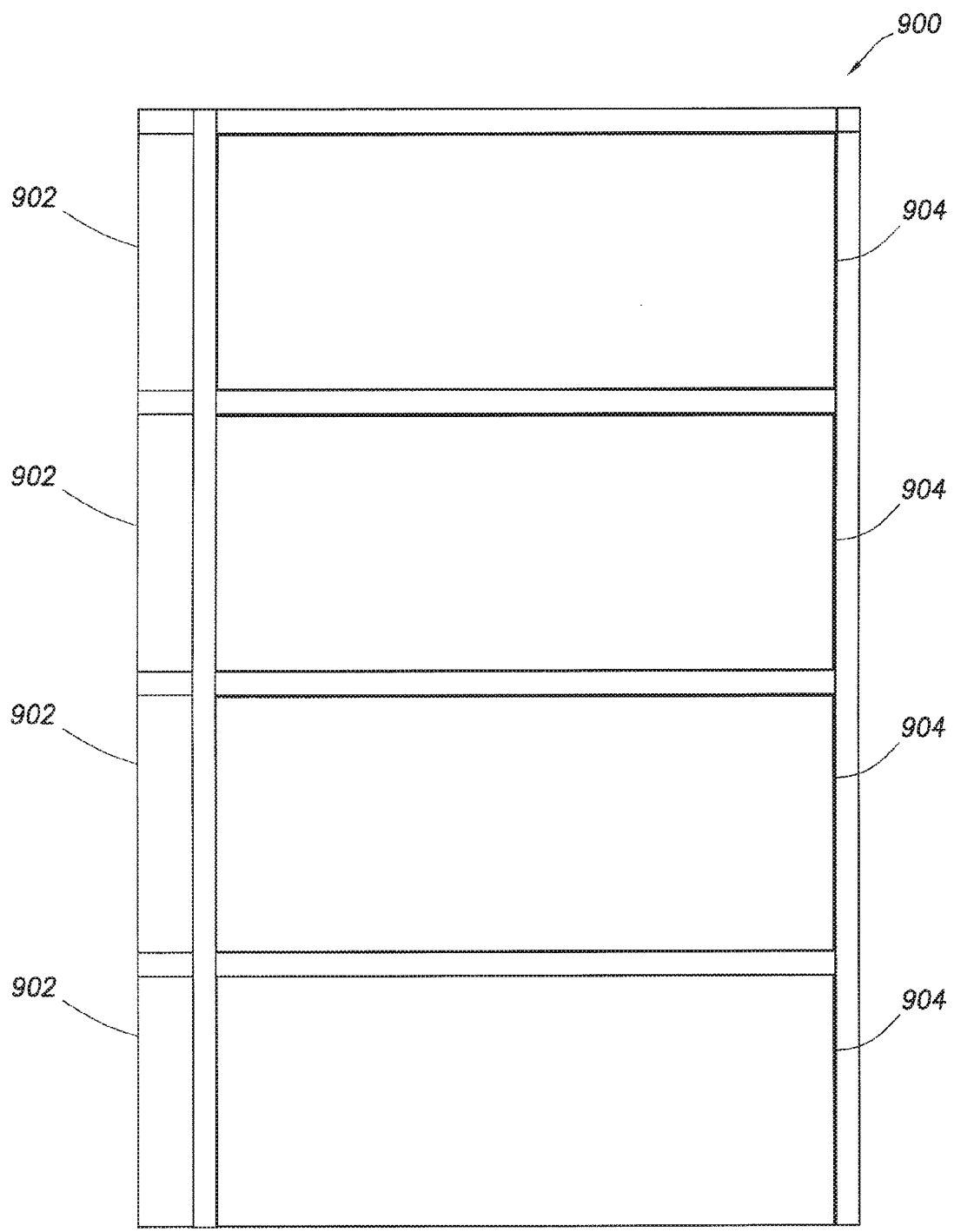
FIG. 9 shows an example rack server system incorporating a side-mounted, rack-level, scalable and modular power infrastructure, according to aspects of the present disclosure.

In certain other embodiments, a scalable and modular power infrastructure similar to the infrastructure shown in FIGS. 1 and 8 may be deployed outside of used rack space. In FIG. 8, for example, space within rack 800 is used for the power equipment, decreasing the server capacity. In certain embodiments, the power infrastructure may be deployed outside of usable server space within the rack. FIG. 9 shows an example unpopulated rack 900. The rack, for example, may include multiple compartments 904, each of which may be fully populated with servers. Side-car chassis 902 containing modular and scalable power infrastructure may be mounted to the side of the rack 900, preserving usable rack space.

Figure 10:
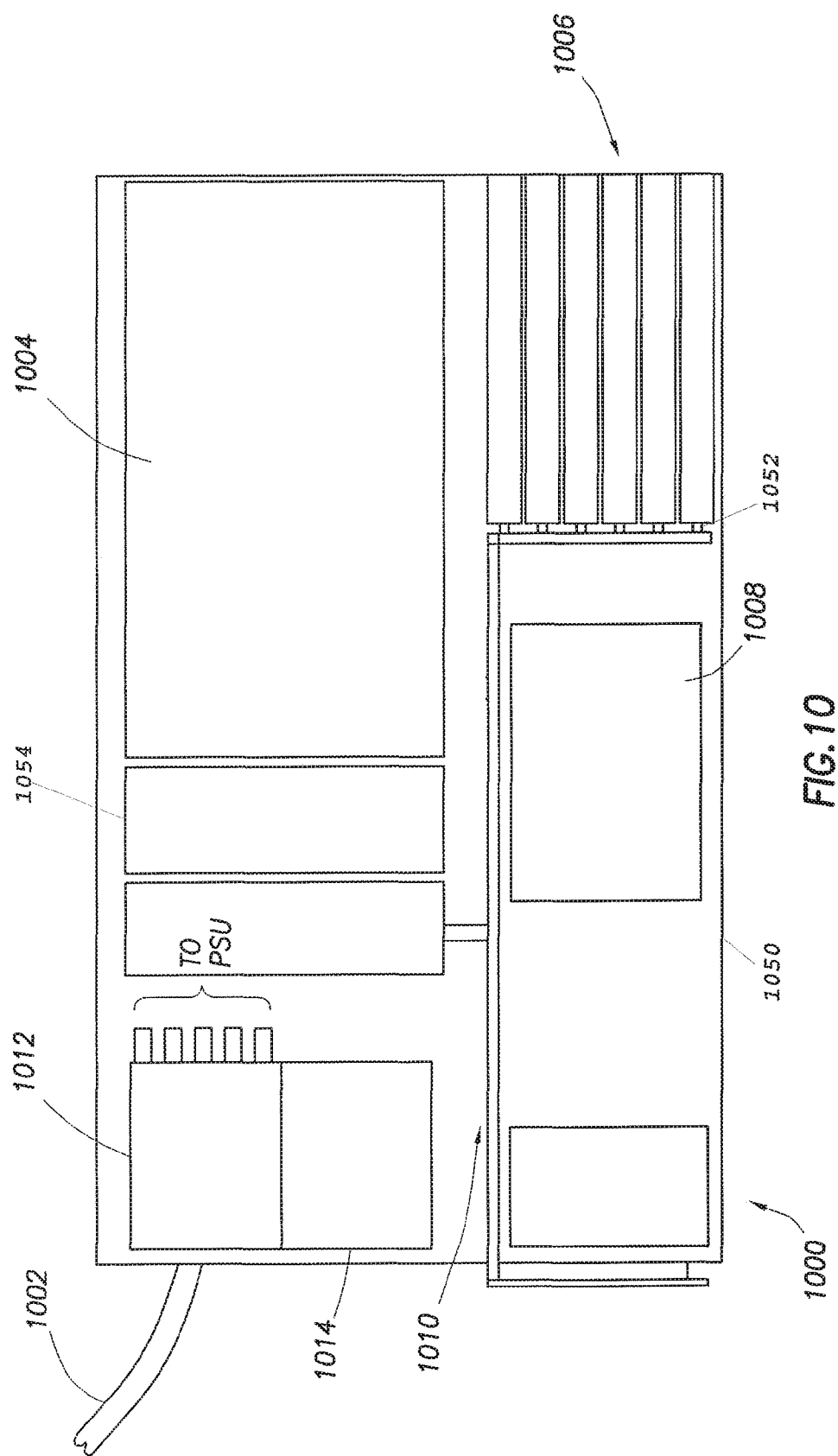
FIG. 10 shows an example side-mounted, rack-level, scalable and modular power infrastructure, according to aspects of the present disclosure.

FIG. 10 shows an example configuration of a modular and scalable power infrastructure 1000 deployed in a side-car chassis 1050. As can be seen, the power infrastructure 1000 may receive AC input power 1002 at a PCIB 1012. In certain embodiments, the PCIB 1002 may include a modular wiring block, such as wiring block 308 above, or may be detachable, similar to PCIB 500 from FIG. 5a. In certain embodiments, power infrastructure 1000 may comprise phase-balancing and distribution circuitry similar to the wiring diagram in FIG. 3. PSUs 1006 may be installed within the side-car chassis 1050 through an opening or power supply unit slot at the front of the side-car chassis 1050, and may receive pluggable AC power. Each of the PSUs 1006 may be coupled to a busbar 1010, via form-factor connections 1052 within the side-car chassis 1050. Advantageously, the number of PSUs, and total output power, may be scalable by inserting additional PSUs within the infrastructure 1000. Likewise, the infrastructure may be modular by accepting commodity PSUs via the form-factor connections 1052.

The busbar 1010 may be partially disposed within the chassis 1050 and may provide power to servers within a rack. In addition, the power infrastructure 1000 may include a BBU disposed within the chassis 1050, similar to the BBUs described above. The BBU may include a hot-swappable battery 1004, which may be installed through the front of the side-car chassis 1050, and connect with connector 1054. The BBU may also include power modules and a power module controller 1008, and may cause the battery 1004 to either charge from the busbar 1010 or discharge power to the busbar 1010. Additionally, the power infrastructure 1000 may include AC power outlets 1014 to power equipment for the rack/server system.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Although the present disclosure has been described in detail, it should be understood that various changes, substitutions, and alterations can be made hereto without departing from the spirit and the scope of the invention as defined by the appended claims. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. A power distribution unit (PDU) system, comprising:
   a first detachable interface, wherein the first detachable interface is configured to couple with a first integrated connector of a rack-level power infrastructure;
   a second detachable interface, wherein the second detachable interface is configured to couple with a second integrated connector of the rack-level power infrastructure;
   a first and a second detachable power cable interface boxes, wherein each of the first and second detachable power cable interface boxes comprises a wiring block wherein the wiring block arranges power from a first alternating current (AC) power source and a second AC power source, respectively, into a pre-determined output configuration corresponding to a detachable interface, wherein the wiring block comprises a printed circuit board;
   one or more relays coupled between one or more output wires of the wiring block and one or more switched AC outlets;
   a first power distribution unit (PDU), wherein the first PDU includes a first connector corresponding to a first detachable interface, wherein the first PDU is operable to receive AC power from a first detachable power cable interface box through the first connector, wherein the first PDU comprises a first power supply unit (PSU), and wherein the first PSU comprises at least one of a single-phase PSU and a phase-balancing and distribution PSU; and a second PDU, wherein the second PDU includes a second connector corresponding to a second detachable interface, wherein the second PDU is operable to receive AC power from a second detachable power cable interface box through the second connector and wherein the first PDU is cross-cabled with the second PDU to provide redundant AC power, wherein the second PDU comprises a second PSU, and wherein the second PSU comprises at least one of a single-phase PSU and a phase-balancing and distribution PSU.

2. The system of claim 1, wherein each of the one or more relays are coupled to the wiring block via two different wires of a terminal.

3. The system of claim 2, wherein at least one of the first PSU and the second PSU is removable.

4. The system of claim 2, wherein one or more output wires of the terminal are each connected respectively to one or more individual breakers to protect against power surges.

5. The system of claim 2, wherein each of one or more output wires of the terminal are coupled individually to one or more dedicated cables.

6. The apparatus of claim 5, wherein the one or more dedicated cables are connected in a staggered configuration with the one or more switched AC outlets.

7. The system of claim 6, wherein each of the one or more switched AC outlets is coupled to a unique combination of the one or more dedicated cables.

8. The system of claim 1, wherein the one or more relays are triggered from a remote source.

9. The system of claim 1, further comprising a distribution element coupled to at least one of the first PSU and the second PSU.

10. The system of claim 1 further comprising:
a batter backup unit disposed within the PDU system.

11. A method for coupling alternating current (AC) power to a rack-level power infrastructure, comprising:
receiving at a first power distribution unit (PDU) alternating current (AC) power from a first AC power source;
receiving at a second PDU AC power from a second AC power source;
determining a type of the first AC power source;
determining a type of the second AC power source;
coupling the first AC power source to a first power cable interface box (PCIB);
coupling the second AC power source to a second PCIB;
cross-cabling the first PDU and the second PDU to provide redundant AC power, wherein the first PDU comprises a first power supply unit (PSU), wherein the first PSU comprises at least one of a single-phase PSU and a phase-balancing and distribution PSU, wherein the first PDU is cross-cabled with the second PDU to provide redundant AC power, wherein the second PDU comprises a second PSU, and wherein the second PSU comprises at least one of a single-phase PSU and a phase-balancing and distribution PSU;
arranging, respectively, a set of wires from the first AC power source and the second AC power source to correspond to a pre-determined pin configuration of a first detachable interface and a second detachable interface, respectively, wherein arranging the set of wires comprises selecting a wiring block corresponding to the type of the AC power source, and wherein the wiring block comprises a printed circuit board;
coupling one or more relays between one or more output wires of the wiring block and one or more switched AC outlets;
coupling the first detachable interface to a first integrated connector of the rack-level power infrastructure; and
coupling the second detachable interface to a second integrated connector of the rack-level power infrastructure.

12. The method of claim 11, wherein each of the one or more relays are coupled to the wiring block via two different wires of a terminal.

13. The method of claim 11, further comprising removing at least one of the first PSU and the second PSU, wherein at least one the first PSU and the second PSU comprises a plurality of PSUs.

14. The method of claim 11, wherein one or more output wires of the terminal are each connected respectively to one or more individual breakers to protect against power surges.

15. The method of claim 11, wherein each of one or more output wires of the terminal are coupled individually to one or more dedicated cables.

16. The method of claim 15, wherein the one or more dedicated cables are connected in a staggered configuration with the one or more switched AC outlets.

17. The method of claim 16, wherein each of the one or more switched AC outlets is coupled to a unique combination of the one or more dedicated cables.

18. The method of claim 11, further comprising coupling a distribution element to at least one of the first PSU and the second PSU.

19. An information handling system, comprising:
a processor;
a memory element coupled to the processor; and
a direct current (DC)/DC power supply coupled to the processor, wherein the DC/DC power supply receives power from a rack-level power infrastructure, wherein the rack-level power infrastructure comprises:
a first detachable power cable interface box (PCIB), wherein the first detachable PCIB is operable to couple with a first alternating current (AC) power source, and wherein the first detachable PCIB includes a first detachable interface;
a second detachable PCIB, wherein the second detachable PCIB is operable to couple with a second AC power source, and wherein the second detachable PCIB includes a second detachable interface;
one or more relays coupled between one or more output wires of the first detachable PCIB and the second detachable PCIB and one or more switched AC outlets
a first power distribution unit (PDU), wherein the first PDU includes a first connector corresponding to the first detachable interface, wherein the first PDU is operable to receive AC power from the first detachable PCIB through the first connector, wherein the first PDU comprises a first power supply unit (PSU), and wherein the first PSU comprises at least one of a single-phase PSU and a phase-balancing and distribution PSU; and
a second PDU, wherein the second PDU includes a second connector corresponding to the second detachable interface, wherein the second PDU is operable to receive AC power from the second detachable PCIB through the second connector, wherein the second PDU comprises a second PSU, and wherein the second PSU comprises at least one of a single-phase PSU and a phase-balancing and distribution PSU.

20. The information handling system of claim 19, at least one of the first PSU and the second PSU is removable.

\* \* \* \* \*